(12) United States Patent
Grover et al.

(10) Patent No.: US 6,404,261 B1
(45) Date of Patent: Jun. 11, 2002

(54) SWITCH CIRCUIT AND SEMICONDUCTOR SWITCH, FOR BATTERY-POWERED EQUIPMENT

(75) Inventors: Raymond J. Grover, Manchester (GB); Franciscus ACM Schoofs, Valkenwaard; Pieter G. Blanken, Nuenen, both of (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/535,594

(22) Filed: Mar. 27, 2000

(30) Foreign Application Priority Data

Mar. 27, 1999 (GB) .............................................. 9907021

(51) Int. Cl.[7] .............................................. H03L 5/00
(52) U.S. Cl. ...................................... 327/320; 327/314
(58) Field of Search ............................... 327/309, 314, 327/320, 325, 330; 361/56, 91

(56) References Cited

U.S. PATENT DOCUMENTS

| | | | |
|---|---|---|---|
| 3,943,552 A | | 3/1976 | Shanon et al. ................. 357/15 |
| 5,208,492 A | * | 5/1993 | Masumoto et al. ............ 326/50 |
| 5,373,435 A | * | 12/1994 | Jayaraman et al. ............ 363/98 |
| 5,467,050 A | * | 11/1995 | Clapp, III et al. ........... 327/110 |
| 5,682,050 A | | 10/1997 | Williams ..................... 257/368 |

* cited by examiner

Primary Examiner—Kenneth B. Wells
(74) Attorney, Agent, or Firm—Steven R. Biren

(57) ABSTRACT

A switch circuit for battery-powered equipment, for example a mobile telephone or a portable computer, comprises a 4-terminal bi-directional semiconductor switch (M1) and a protection diode (Dbg). The switch (M1) has a control-gate terminal (g) for applying a control signal (Vg) to form a conduction channel (12) in a body region (11) of the switch, for turning the switch (M1) on and off between a battery (B) and a power line (2) of the equipment. The switch (M1) also has a back-gate terminal (b; bg) in a bias path that serves for applying a bias potential (Vmin) to the body region (11). The protection diode (Dbg) has a diode path in series with the back-gate terminal (b; bg) so as to provide in the bias path a rectifying barrier (25; 25') that blocks current flow between the body region (11) and the gate-bias terminal (b, bg) in the event of a reverse voltage polarity across the switch (M1), for example when recharging the battery (B). Preferably the protection diode (Dbg) is integrated with a semiconductor device body (10) of the switch (M1), with a p-n junction (25') or Schottky barrier (25) forming its rectifying barrier in the bias path between the body region (11) and the gate-bias terminal (bg).

11 Claims, 6 Drawing Sheets

SWITCH CIRCUIT AND SEMICONDUCTOR SWITCH, FOR BATTERY-POWERED EQUIPMENT

BACKGROUND OF THE INVENTION

This invention relates to switch circuits for battery-powered equipment, for example mobile telephones or portable computers. The invention also relates to 4-terminal bi-directional semiconductor switches suitable for use in such switch and to battery-powered equipment comprising such switches and switch circuits.

United States patent specification U.S. Pat. No. 5,682,050 discloses several switch circuits for a battery-powered equipment that comprise a 4-terminal bi-directional switch and a protection diode. The switch has a main current path between first and second main terminals that serve for coupling the switch between a battery and a power line of the equipment. The switch has a control-gate terminal that serves for applying a control signal to the switch to form a conduction channel in a body region of the switch, the conduction channel forming part of the main current path for turning the switch on and off. The switch has a back-gate terminal in a bias path that serves for applying a bias potential to the body region. The whole contents of U.S. Pat. No. 5,682,050 are hereby incorporated herein as reference material.

Included in U.S. Pat. No. 5,682,050 is a disclosure of circuitry to protect the switch and battery in the event of a reverse voltage polarity across the first and second main terminals of the switch. Such an event can occur if, for example, the switch circuit is connected to a battery charger with reversed connections, i.e. with the wrong polarity. The body region of the switch acts as a base region of a parasitic bipolar transistor coupled in parallel with the switch.

FIGS. 12B and 12C of U.S. Pat. No. 5,682,050 show protection circuitry having a protection diode (a Schottky diode) that has a diode path coupled to a terminal of the switch, namely to a particular one of the first or second main terminals. This particular one main terminal is the one that is not connected to the battery but is connected to the battery charger.

In the FIG. 12B circuit, the current through the diode is limited by a resistor $R_B$ that connects the diode to the back-gate terminal at ground potential. In the FIG. 12C circuit, the diode is connected directly to ground, independent of the back-gate terminal. In each case, the intention is to prevent turn on of the parasitic bipolar transistor. U.S. Pat. No. 5,682,050 rejects these simple diode circuits as being unable to provide adequate protection for the switch and the battery. Instead, U.S. Pat. No. 5,682,050 proposes a more complex protection circuit (FIG. 13) with three MOSTs. In all the protection circuits shown in U.S. Pat. No. 5,682,050 (FIGS. 12B to 12D, 13A to 13E, and 14A & 14B), the body region of the switch is connected to the back-gate terminal at ground potential via a/the resistor $R_B$.

SUMMARY OF THE INVENTION

It is an aim of the present invention to provide switch circuits and 4-terminal switches with a protection diode arrangement that can be simple and yet can provide adequate protection in the event of a reverse voltage polarity across the first and second main terminals of the switch.

Switch circuits and/or switches in accordance with the present invention include a protection diode having a diode path in series with the back-gate terminal of the switch so as to provide a rectifying barrier in its bias path. This rectifying barrier blocks current flow between the body region of the switch and its back-gate terminal in the event of a reverse voltage polarity across the first and second main terminals of the switch. Thus, in the situation where the body region of the switch would act as a base region of a parasitic bipolar transistor, then the rectifying barrier of the protection diode in accordance with the invention blocks base current to the body region (parasitic base) from the back-gate terminal.

A Schottky barrier or a p-n junction may form the protection diode. The switch and the protection diode may be separate components each comprising a semiconductor body with its own terminals. Alternatively, the protection diode may be integrated with a semiconductor device body of the switch or of, for example, a control IC (integrated circuit).

Thus, for example, the present invention provides embodiments of novel switch circuits having the features set out in claims 1 to 3, and there are also provided embodiments of novel 4-terminal bi-directional semiconductor switches (with integrated protection diodes) having, for example, the features set out in claims 4 to 9.

BRIEF DESCRIPTION OF THE DRAWING

These and other embodiments of the present invention are now described, by way of example, with reference to the accompanying diagrammatic drawings, in which:

It should be noted that all the Figures are diagrammatic. In FIGS. 3 to 8 and 10 relative dimensions and proportions of parts of the drawings have been shown exaggerated or reduced in size, for the sake of clarity and convenience in the drawings. The same reference signs are generally used to refer to corresponding or similar features in modified and different embodiments.

DESCRIPTION OF THE PREFERRED EMBODIMENTS

The switch circuits of FIGS. 1, 2, 9, 11, and 12 may be used in a battery-powered equipment, such as a mobile phone or portable computer.

The circuit comprises a 4-terminal bi-directional semiconductor switch M1 which may serve for connecting and disconnecting a battery B in the operation of the equipment. One particular application of current importance is with re-chargeable battery packs (e.g. lithium-ion battery packs) in cellular telephones. The switch M1 has to conduct in both directions during normal operation (either charging or discharging the battery B). The switch M1 has to block in case of overcharging or overdischarging or other faulty conditions. Overdischarging may occur due to discharge currents causing the battery voltage to drop below some lower limit value. Such currents may occur during normal operation or may be caused by short-circuiting or by a reverse-connected charger 5.

The switch M1 is a gated field-effect device, typically a lateral or vertical power MOST, specific examples of which are illustrated in FIGS. 3 to 8. The switch M1 has a main current path between first and second main terminals s and d that serve for coupling M1 between the battery B and a power line 2. Usually the line 2 is that to which an electrical load EL of the equipment is connected. A control-gate terminal g serves in known manner for applying a control signal Vg to M1 to form a conduction channel 12 in a body region 11 of the switch. This conduction channel 12 (present only in the on-state of the switch) forms part of the main current path, and so it functions for turning M1 on and off.

Figure 1:
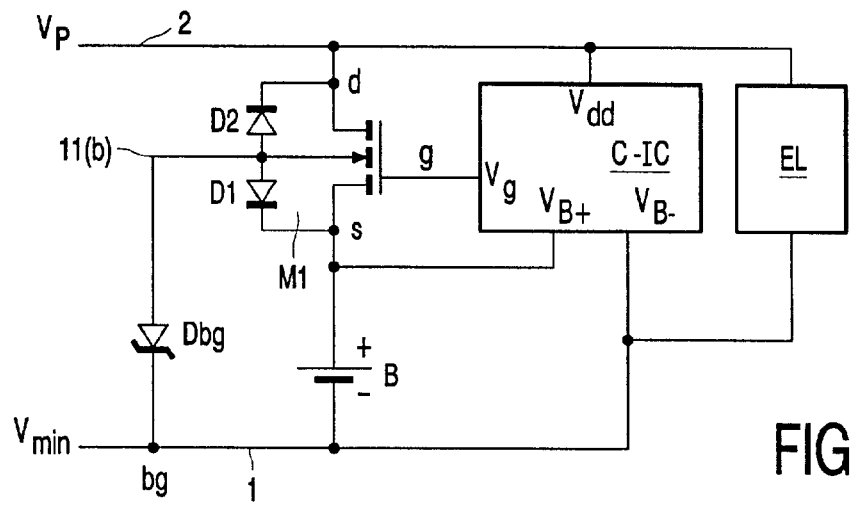
FIG. 1 is a circuit diagram of one embodiment of a switch circuit in accordance with the present invention, comprising a 4-terminal bi-directional semiconductor switch and a protection diode.
Figure 2:
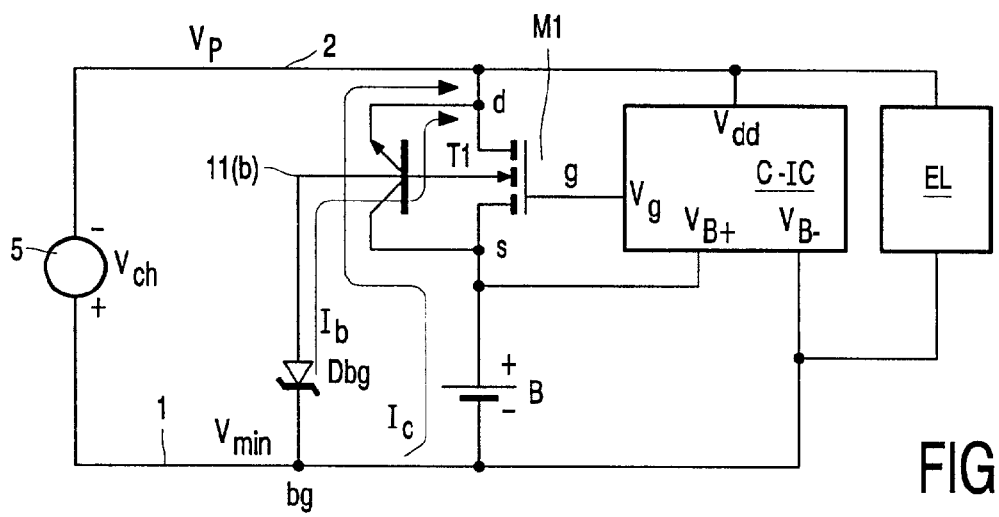
FIG. 2 is a circuit diagram of the switch circuit of FIG. 1 with the addition of a battery charger connected with the wrong polarity.
Figure 8:
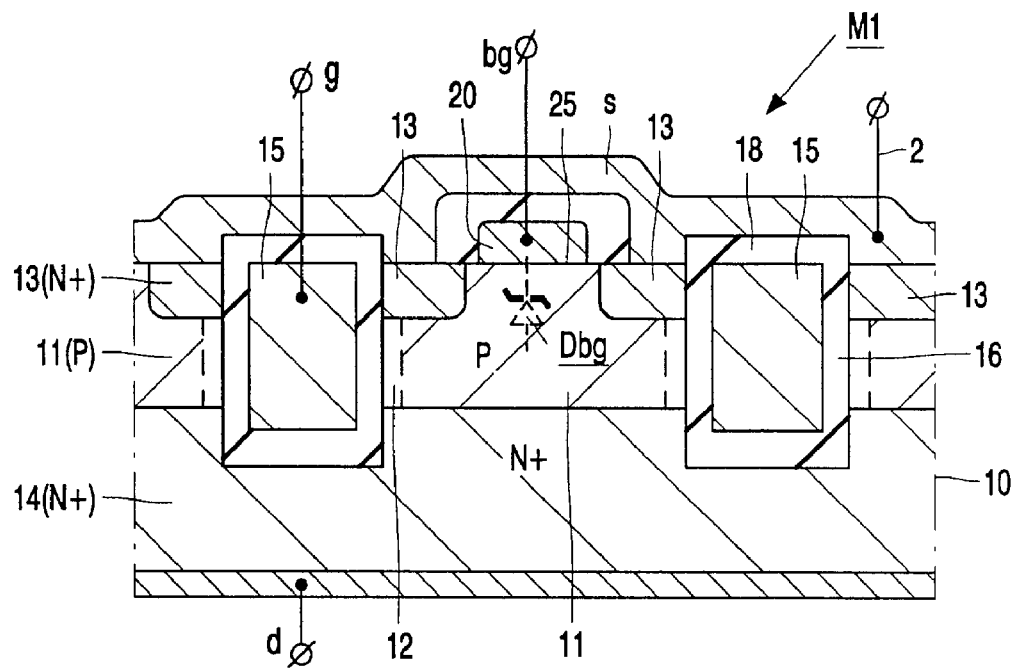
Figure 9:
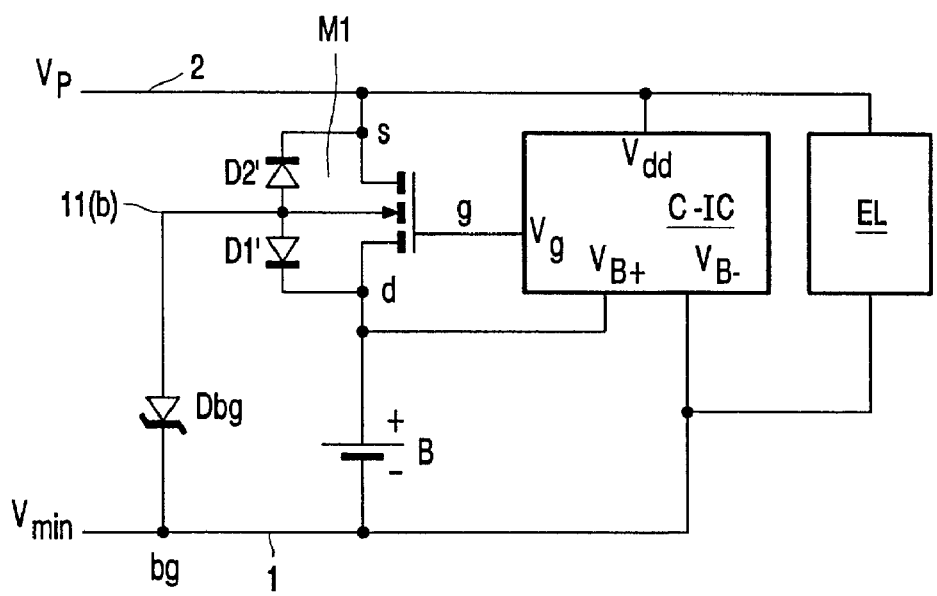
FIG. 9 is a circuit diagram of another embodiment of a switch circuit in accordance with the present invention, suitable for comprising the 4-terminal bi-directional semiconductor switches of FIGS. 7 and 8.

The switch M1 has a back-gate terminal in a bias path that serves for applying a bias potential Vmin (on line 1) to the body region 11. This back-gate terminal of M1 may be a direct terminal connection b to the body region 11 or an indirect terminal connection bg to the body region 11. It is a direct terminal connection b in the known circuits of FIGS. 11 and 12. In the integrated switches of FIGS. 3 to 8, there is an additional integrated component (diode Dbg) in the bias path between the back-gate terminal bg of M1 and its body region 11. In the circuits of FIGS. 1, 2 and 9, the back-gate terminal of the switch may be a direct terminal b if Dbg is not integrated with M1, or it may be an indirect terminal bg if Dbg is integrated.

In the circuits shown, the switch M1 is connected at the high side (+) of the battery B, and the line 1 is typically at ground potential (Vmin=0V). A control circuit C-IC (for example an integrated circuit of known type) applies the control signal Vg to the switch terminal g, and it may also apply and/or sense a voltage Vdd to the power line 2. As illustrated in these embodiments, the control circuit C-IC may also take sense inputs $V_{B+}$ and $V_{B-}$ from the positive and negative terminals of the battery B.

The switch circuits of FIGS. 1, 2 and 9 additionally comprise a protection diode Dbg to protect the switch M1 and battery B in the event of a reverse voltage polarity across the first and second main terminals s and d of the switch. In accordance with the present invention, the diode path of Dbg is coupled to the back-gate terminal (b or bg) of M1. Thus, as is discussed below, the diode path of Dbg is in series with the back-gate terminal (b or bg) so as to provide in the bias path a rectifying barrier that blocks current flow between the body region 11 and the back-gate terminal in the event of a reverse voltage polarity across the first and second main terminals s and d.

Figure 11:
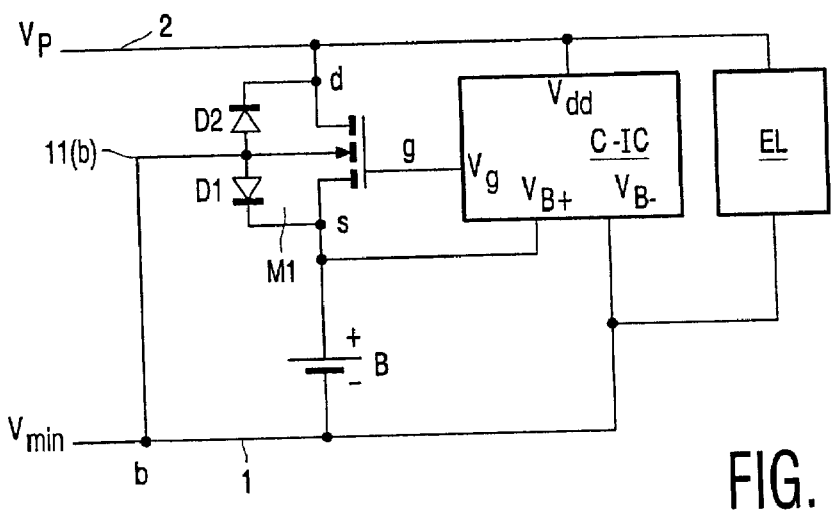
FIG. 11 is a circuit diagram of a known switch circuit comprising a 4-terminal bi-directional semiconductor switch, without a back-gate protection diode in accordance with the present invention.

In the known circuit of FIG. 11, the high-side bi-directional switch M1 is of known type. Its body region 11 is directly connected by the back-gate terminal b to the line Vmin, and hence to the negative terminal of the battery B. The source-to-backgate p-n junction Dl of this power MOST switch M1 is reverse biased under all circumstances by the battery B. The source-to-backgate p-n junction D1 is designed to have a breakdown voltage that is higher than the battery voltage. The so-called body effect or back-gate effect (resulting from the biasing of the body region 11) causes a slight increase of the MOS threshold voltage.

As long as the external voltage is positive (i.e. Vp−Vmin>0V) the drain-to-backgate p-n junction D2 of M1 also is reverse biased. The leakage currents of both reverse-biased junctions D1 and D2 flow through the connection from backgate terminal b to the ground line 1 (connected to the negative terminal of the battery B).

Figure 12:
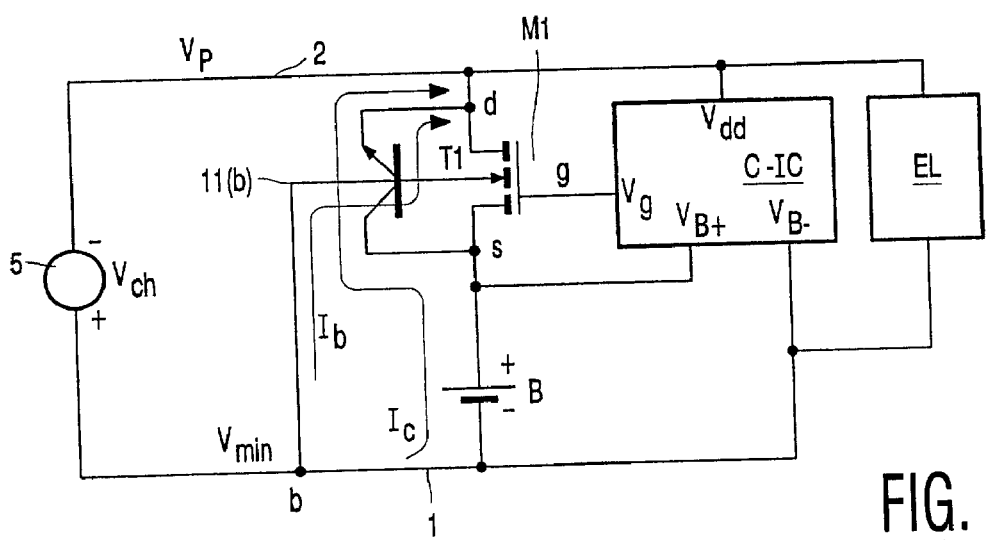
FIG. 12 is a circuit diagram of the known switch circuit of FIG. 11 with the addition of a battery charger connected with the wrong polarity.

However, in the switch circuit of FIG. 11, the drain-to-backgate junction D2 of the high-side switch M1 can become forward biased for negative external voltages (i.e. Vp−Vmin<0V). This may occur if, for example, a battery charger 5 is connected with "wrong" polarity as illustrated in FIG. 12. The charger 5 (with the wrong polarity voltage Vch) may force a large current through the forward-biased junction D2. Because the two back-gate junctions D1 and D2 in fact form a parasitic bipolar transistor T1 (see FIG. 12), this current can be considered to be the base current Ib of the parasitic bipolar transistor T1. Consequently, collector current Ic will be drawn by T1 from the battery B, as shown in FIG. 12.

The value of the battery discharge current Ic depends on the current gain of the parasitic bipolar transistor T1, but it may be expected to be intolerably high. Thus the battery B is discharged, and the control C-IC can do nothing to stop the battery B from being discharged. This is unacceptable. As described in U.S. Pat. No. 5,682,050, the situation cannot be remedied successfully by providing a series resistor in the back-gate bias path, nor by providing a Schottky diode clamp at the switch terminal d.

The present invention provides a simple diode modification of the circuit of FIG. 11 that does ensure that, when the external voltage is negative (e.g. if a battery charger 5 is connected with "wrong" polarity) then the battery B is not discharged. This is achieved by adding the diode Dbg in the back-gate terminal connection of the power MOST M1, as illustrated in the novel circuits of FIGS. 1, 2 and 9 and in the novel integrated switches of FIGS. 3 to 8. The diode Dbg prevents the parasitic bipolar transistor T1 from becoming active.

When the switch M1 is conducting (either in battery-charge mode or in battery-discharge mode) the terminals d and s will have voltages that are approximately equal to the battery voltage, and so generally larger than 1V. The junctions D1 and D2 will both be reverse-biased by voltages approximately equal to the battery voltage Vbat. Diode Dbg will be forward biased by the leakage currents through D1 and D2.

When the switch M1 blocks to avoid over-charging, the diode Dbg will still be forward biased. The junction D1 will still be reverse-biased by a voltage slightly less than the battery voltage Vbat. The reverse-bias voltage across junction D2 will increase to a value approximately equal to the unloaded charger voltage Vch.

When the switch M1 blocks to avoid over-discharging and the external voltage still is positive (Vp−Vmin>0V), then the reverse bias voltages will be equal to or smaller than those in the above-mentioned situation.

When the switch M1 blocks to avoid over-discharging and the external voltage is negative (Vp−Vmin<0V, e.g. due to a charger 5 being connected with "wrong" polarity as illustrated in FIG. 2), then both the junction D1 and the diode Dbg will be reverse-biased; the junction D2 will be forward biased by the leakage currents through D1 and Dbg. The reverse-bias voltage across the protection diode Dbg is slightly less than Vch. The reverse-bias voltage across the junction D1 is approximately equal to (Vch+Vbat). The leakage currents through D1 and Dbg together provide a base current for the parasitic bipolar transistor T1 (formed by D1 and D2), which will be amplified by its current-gain factor, as shown in FIG. 2. However, the net discharge current through the battery B (corresponding to the collector current Ic) will be small, thereby solving the above-mentioned problem of the FIGS. 11 and 12 circuit.

The protective diode Dbg can be added as a separate component, or it can be integrated in the control circuit C-IC, or it can be integrated in the switch M1.

Figure 3:
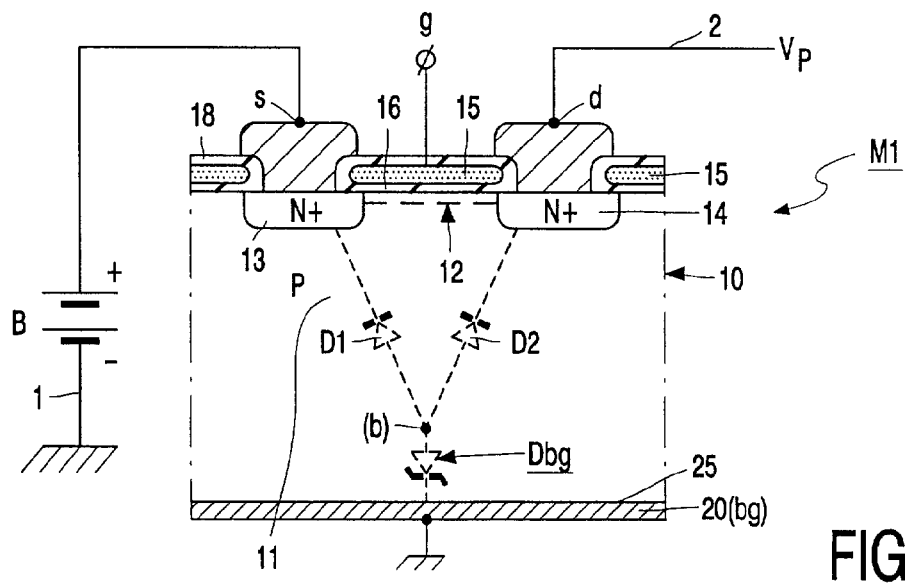
FIGS. 3 to 8 are cross-sectional views of part of the active device area of different respective embodiments of a 4-terminal bi-directional semiconductor switch which has an integrated protection diode in accordance with the present invention and which is suitable for the circuit of FIG. 1.
Figure 4:
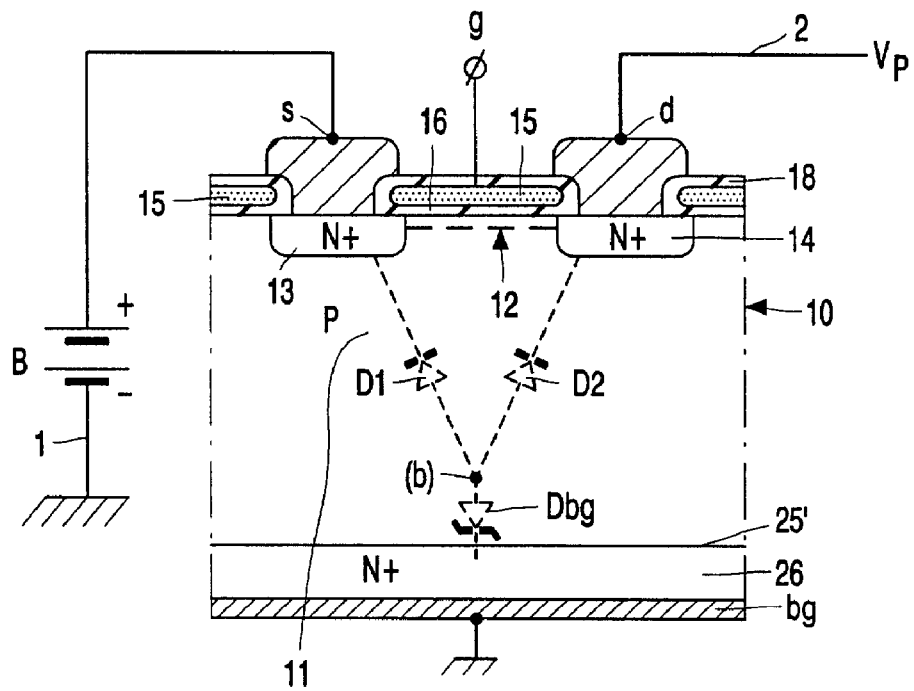

By way of example, FIGS. 3 and 4 illustrate two different ways of integrating Dbg in a lateral power MOS transistor M1 which is otherwise of the general type illustrated in U.S. Pat. No. 5,682,050. This bi-directional MOS transistor M1 comprises a semiconductor body 10, typically of silicon. The body region 11 of M1 may be a substrate region of the body 10, and is of p-type silicon in the examples of FIGS. 3 and 4. The source and drain of M1 comprise n-type doped regions which may be formed in known manner by dopant implantation and/or diffusion at the top surface of the substrate region. In the illustrated embodiments, the control gate is of the insulated-gate (MOS) type comprising a gate electrode 15 that is coupled to the channel-accommodating region by a gate dielectric 16. The source and drain terminals comprise separate metal electrodes s and d that are connected to the regions 13 and 14 at windows in a thick insulating layer 18 at this surface. The structure of FIGS. 3 and 4 as so far described for M1 is of known type.

However, in accordance with an integrated form of the present invention, the protective diode Dbg provides a rectifying barrier 25 or 25' in the bias path between the body region 11 and the gate-bias terminal bg of M1.

In the form illustrated in FIG. 3, this rectifying barrier is a Schottky junction 25 formed directly between the body region 11 and a metal-based layer 20. The Schottky electrode layer 20 forms at least the silicon-adjacent part of the metallisation of the back-gate terminal bg. Thus, in a specific example, the electrode layer 20 of FIG. 3 may comprise a thin barrier layer of titanium adjacent the silicon body region 11 and a thicker more conductive layer (for example, aluminum) on the titanium.

In the form illustrated in FIG. 4, the rectifying barrier is a p-n junction 25' between the body region 11 and a diode region 26 of opposite conductivity type, i.e. n-type in this specific example. This diode region 26 can be formed by dopant implantation and/or diffusion at the back surface of the p-type substrate. The back-gate terminal bg is provided by the back metallisation of the substrate which is connected to the diode region 26.

Unlike the known switches which do not have integrated diodes Dbg, the back metallisation on the device body 10 in the switches of FIGS. 3 and 4 does not form any ohmic contact with the p-type body region 11.

The present invention may be combined with other features disclosed in U.S. Pat. No. 5,682,050. Thus, for example, a Schottky clamp diode may be coupled to the source s, in addition to providing the diode Dbg in the back-gate connection.

Figure 5:
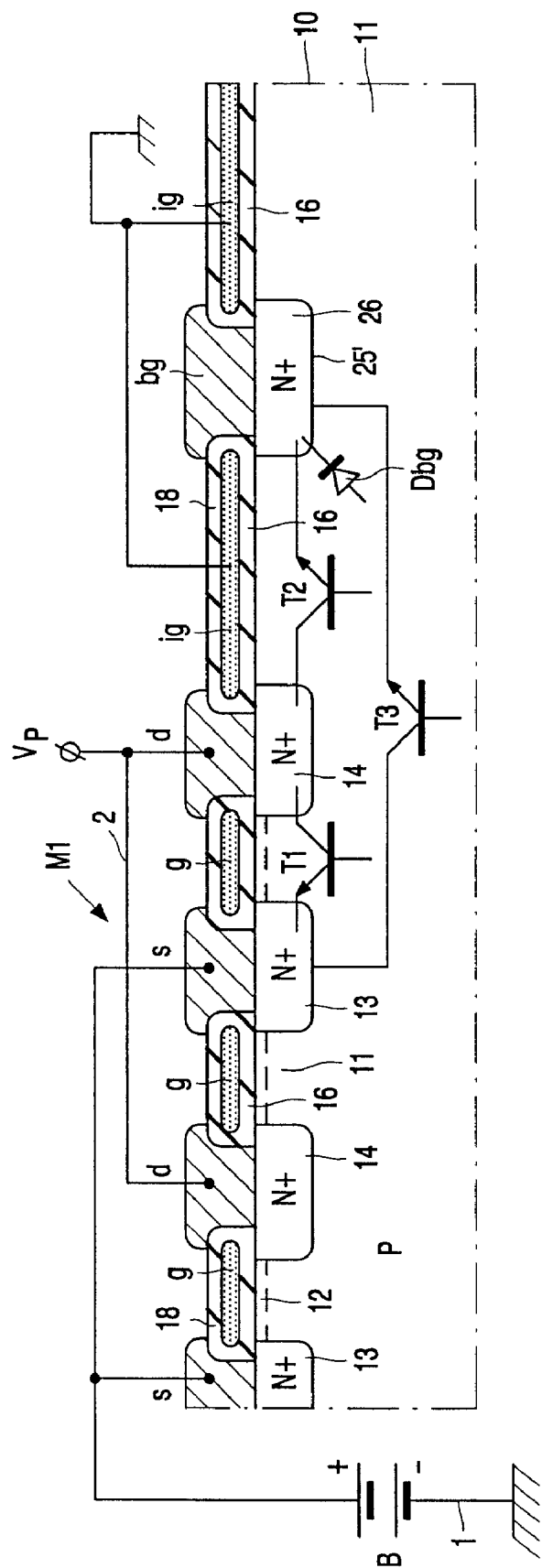
Figure 6:
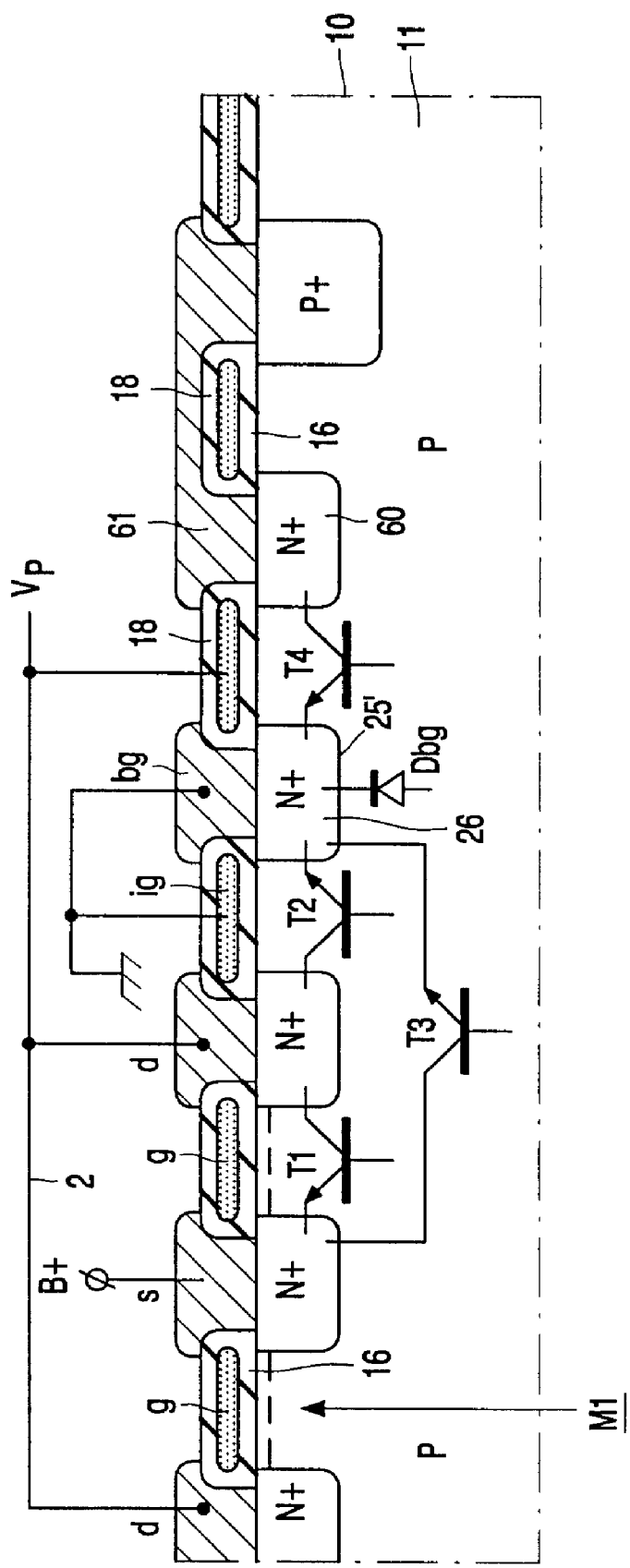

The switches of FIGS. 3 and 4 are lateral devices in which the source and drain regions 13 and 14 are present adjacent to the same surface of the body 10, and the protective diode Dbg is formed at the opposite (i.e. back) surface. FIGS. 5 and 6 illustrate other embodiments of lateral devices, but in this modification the protective diode Dbg is integrated at the same surface as the source and drain regions 13 and 14. The protective diode Dbg may be formed with a Schottky barrier 25 at this silicon surface. However, FIGS. 5 and 6 illustrate diodes Dbg with a p-n junction 25'.

Thus, the diodes Dbg of FIGS. 5 and 6 comprise a semiconductor region 26 of the opposite conductivity type (p-type in these specific examples) which may be formed in the same doping stage as the source and drain regions 13 and 14. In these modified embodiments, the control-gate terminal g and back-gate terminal bg are present adjacent to this common face of the switch body 10. They are separated from each other by an isolating gate ig which may be formed in the same process steps as the control gate g. However, the isolating gate ig is separate from the control gate g and is separately biased to avoid the formation of a channel 12 adjacent to the diode region 26. Preferably the isolating gate ig is connected to the back-gate terminal bg, and hence to 0V.

There are additional parasitic bipolar transistors T2 and T3 in the lateral devices of FIGS. 5 and 6 with integrated p-n diodes Dbg. These parasitic T2 and T3 are formed between the diode region 26 and the source and drain regions 13 and 14. They amplify leakage currents through Dbg. However, the amplifying effects of T2 and T3 can be reduced to an acceptable level by (i) increasing the lateral distance between the diode region 26 and the switch regions 13 and 14, and/or (ii) locally increasing the doping concentration of the body region 11 below the isolating gate ig, and/or (iii) forming another bipolar transistor T4 as illustrated in FIG. 6.

The device of FIG. 6 has an additional semiconductor region 60 of the same (opposite) conductivity type as regions 13,14 and 26. This region 60 forms T4 with regions 11 and 26. The additional semiconductor region 60 is connected to the body region 11 by metallisation track 61 so as to offset the amplification effect of T2 and T3 on a leakage current through the protection diode Dbg.

Figure 7:
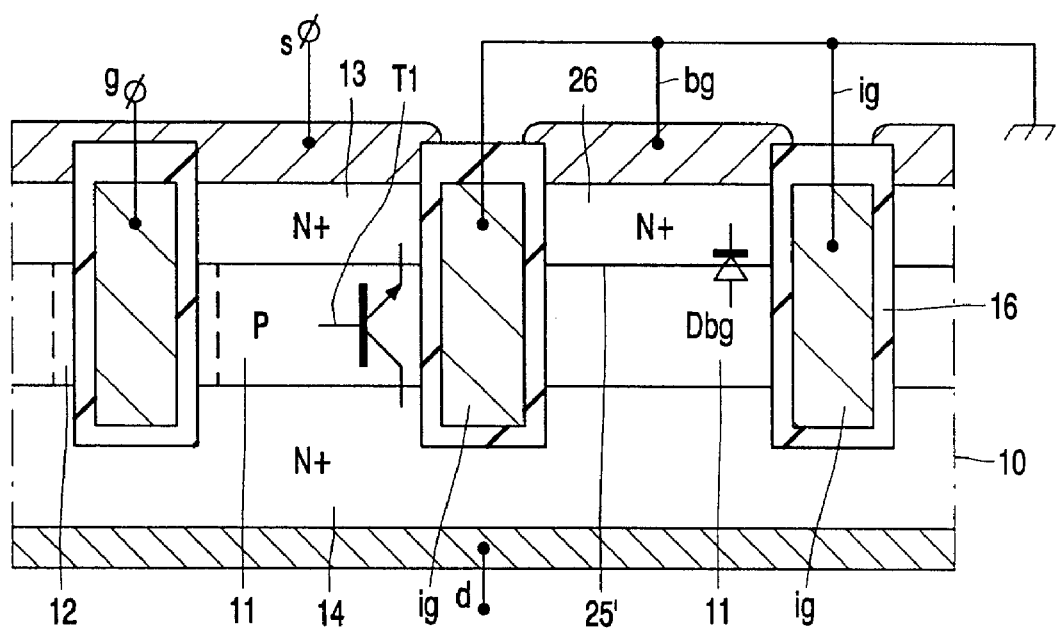

The present invention may also be adopted with switches M1 of vertical configuration. Thus, for example, FIGS. 7 and 8 illustrate embodiments of vertical devices of the so-called trench-gate type, in which the source and drain regions 13 and 14 are formed at opposite surfaces of the body 10, and the channel 12 is formed vertically adjacent to the insulated side-walls of the trench-gate 15. In this case, Dbg may be formed (with an interconnected part of the p-type body region 11) at an area of the top face of the body 10, for example in-between two neighbouring trench areas or outside the area bounded by trenches.

The integrated switch of FIG. 7 is a particularly compact layout. In this device, the diode Dbg is formed in an area between two trenches which comprise an isolating gate ig. The diode Dbg is of the p-n junction type, having a p-n junction 25' between the diode region 26 and the body region 11. This diode region 26 may be formed in the same doping stage as the source region 13. Its electrode connection (forming the back-gate terminal bg of the switch) is separate from the source terminal s, but both bg and s can be formed by patterning a common electrode metallisation layer.

FIG. 8 shows a less compact device layout in which the diode Dbg is formed locally in a central part of a wide area between two trenches which comprise the control gate g. In this specific embodiment, Dbg is a Schottky diode having a Schottky barrier 25 between the p-type body region 11 and the back-gate metallisation bg. An insulating layer 19 is present between the back-gate terminal bg and the separate source terminal s.

Generally in operation of the switch circuit, the reverse-bias voltage that appears across the switch junction (D1) at the side of the battery B is larger than the reverse-bias voltage that appears across the switch junction (D2) at the side of the power line 2. In a vertical device, for example as illustrated in FIGS. 7 and 8, the breakdown voltage of the drain-to-backgate junction (between regions 14 and 11) is generally higher than that of the source-to-backgate junction (between the regions 13 and 11). In this situation, it can be advantageous to interchange the drain and source terminals d and s of the switch M1, as shown in FIG. 9.

It will be evident that many other modifications and variations are possible within the scope of the present invention. Thus, for example, a Schottky diode Dbg may be adopted in the devices of FIGS. 5 and 7 (instead of the p-n junction diode Dbg) if very low leakage currents are specified for the integrated switch M1. Generally the doping of the body region 11 in FIGS. 3 to 8 is chosen to provide the desired gate threshold voltage for the conduction channel 12. This body region doping is normally quite low (for example about $10^{17}$ or $2 \times 10^{17}$ $cm^{-3}$) and suitable for forming a Schottky barrier of desired barrier height with an appropriate choice of the particular metal for the Schottky electrode 20. However, if so desired, the barrier height of the Schottky barrier formed between the body region doping and the Schottky electrode 20 can be adjusted by the inclusion of a shallow highly-doped fully-depleted surface layer in the diode area of the region 11, in accordance with the teaching in U.S. Pat. No. 3,943,552 (our ref: PHB 32349).

Instead of the n-channel enhancement devices illustrated in FIGS. 3 to 8, the conductivity types of the regions of M1 and Dbg may be reversed to produce p-channel enhancement devices which are operated with corresponding changes of voltage polarity. Furthermore, the invention may be used with depletion channel devices. Two or more switches M1 (with integrated protection diodes Dbg) may also be integrated in a common semiconductor body 10, for example to provide a multiple switch in a battery multiplexing circuit for simultaneous charging and discharging of multiple batteries in the equipment. Although monocrystalline silicon is generally used at present for switch bodies 10, other semiconductor materials may be used, for example silicon carbide.

Figure 10:
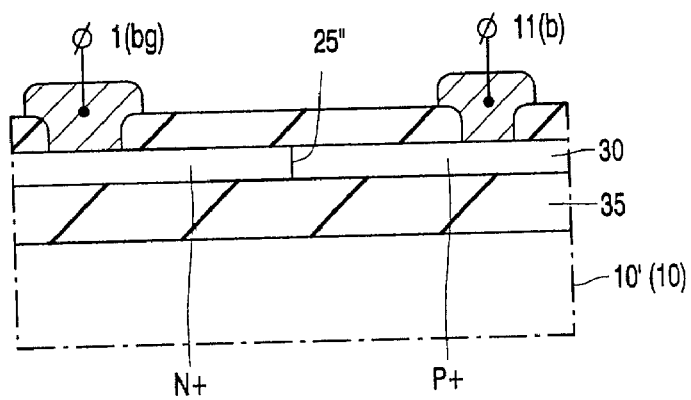
FIG. 10 is a cross-sectional view of another embodiment of an integrated protection diode in accordance with the invention.

Although the drawings illustrate integration in the switch body 10, the protection diode Dbg may alternatively be integrated as a thin-film component, either on the switch M1 or on the control circuit C-IC. As illustrated in FIG. 10, the rectifying barrier of Dbg may be a p-n junction 25" between regions N+ and P+ of opposite conductivity type in a semiconductor layer 30 that forms a part of a connection between the gate-bias terminal line 1 and the body region 11 of the switch M1. This semiconductor layer 30 may be present on a thick insulating layer 35 at a surface of either the switch body 10 or the semiconductor body 10' of the control circuit C-IC. Its diode regions N+ and P+ may be contacted by metallisation tracks at windows in an insulating layer on this diode Dbg. When integrated with the C-IC circuit, these metallisation tracks may be terminals connected respectively to the earth line 1 and to a direct back-gate terminal b of M1. When integrated with M1, these metallisation tracks may be an indirect back-gate terminal bg of M1 and an internal direct connection to the body region 11.

From reading the present disclosure, other variations and modifications will be apparent to persons skilled in the art. Such variations and modifications may involve equivalents and other features which are already known in the design, manufacture and use of semiconductor devices and switch circuits for battery-powered equipment, and component parts thereof, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The Applicants hereby give notice that new claims may be formulated to any such features and/or combinations of such features during the prosecution of the present Application or of any further Application derived therefrom.

What is claimed is:

1. A switch circuit for a battery-powered equipment comprising a 4-terminal bi-directional semiconductor switch and a protection diode, wherein the switch has a main current path between first and second main terminals that serve for coupling the switch in series with a battery between a power line and a reference line of the equipment, the switch has a control-gate terminal that serves for applying a control signal to the switch to form a conduction channel in a body region of the switch, the conduction channel forming part of the main current path for turning the switch on and off, the switch has a back-gate terminal coupled to said reference line to form a bias path that serves for applying a bias potential to the body region, and the protection diode has a diode path coupled to a terminal of the switch to protect the switch and battery in the event of a reverse voltage polarity across the first and second main terminals of the switch, the switch circuit being characterised by the diode path being coupled in the bias path in series with the back-gate terminal so as to provide in the bias path a rectifying barrier that blocks current flow between the body region and the back-gate terminal in the event of a reverse voltage polarity across the first and second main terminals.

2. A switch circuit as claimed in claim 1, further characterised in that the switch and the protection diode are separate components each comprising a semiconductor body with its own terminals, and the back-gate terminal of the switch is connected to a terminal of the diode.

3. A switch circuit as claimed in claim 1, further characterised in that the protection diode is integrated with a semiconductor device body of the switch and has its rectifying barrier in the bias path between the body region and the back-gate terminal of the switch.

4. A 4 terminal bi-directional semiconductor switch comprising first and second main terminals, a control-gate terminal and a back-gate terminal, wherein a main current path of the switch extends between the first and second main terminals and includes a conduction channel formed in a body region of the switch on and off, the back-gate terminal serves for applying a bias potential to the body region, the switch being characterised in that it further comprises an integrated non-parasitic protection diode having a diode path connected in series with the back-gate terminal by providing a rectifying barrier in the bias path between the body region and the back-gate terminal, which rectifying barrier blocks current flow between the body region and the back-gate terminal in the event of a reverse voltage polarity across the first and second main terminals.

5. A switch as claimed in claim 4, further characterised in that the rectifying barrier is a p-n junction between the body region and a semiconductor region of opposite conductivity type, which semiconductor region is connected to the back-gate terminal.

6. A switch as claimed in claim 4, further characterised in that the rectifying barrier is a Schottky junction between the body region and a metal-based layer that forms at least part of the back-gate terminal.

7. A switch as claimed in claim 5, further characterised in that the body region and the semiconductor region of said opposite conductivity type of the protection diode together form a parasitic bipolar transistor with a main terminal region of the switch and form another bipolar transistor with an additional semiconductor region of said opposite conductivity type, and the additional semiconductor region is connected to the body region to offset amplification by the parasitic bipolar transistor of a leakage current through the protection diode.

8. A switch as claimed in claim 4, further characterised in that the control-gate terminal and back-gate terminal are present adjacent to a common face of the switch body and are separated from each other by an isolating gate which is connected to the back-gate terminal.

9. A switch as claimed in claim 4, further characterised in that a semiconductor layer forms a part of a connection between the back-gate terminal and the body region, and the rectifying barrier is a p-n junction between regions of opposite conductivity type in the semiconductor layer.

10. A battery-powered equipment comprising a power line coupled to a switch circuit for a battery-powered equipment comprising a 4-terminal bi-directional semiconductor switch and a protection diode, wherein the switch has a main current path between first and second main terminals that serve for coupling the switch in series with a battery between said power line and a reference line of the equipment, the switch has a control-gate terminal that serves for applying a control signal to the switch to form a conduction channel in a body region of the switch, the conduction channel forming part of the main current path for turning the switch on and off, the switch has a back-gate terminal coupled to said reference line to form a bias path that serves for applying a bias potential to the body region, and the protection diode has a diode path coupled to a terminal of the switch to protect the switch and battery in the event of a reverse voltage polarity across the first and second main terminals of the switch, the switch circuit being characterised by the diode path being coupled in the bias path in series with the back-gate terminal so as to provide in the bias path a rectifying barrier that blocks current flow between the body region and the back-gate terminal in the event of a reverse voltage polarity across the first and second main terminals.

11. A battery-powered equipment comprising a power line coupled to a 4-terminal bi-directional semiconductor switch having first and second main terminals, a control-gate terminal and a back-gate terminal, wherein a main current path of the switch extends between the first and second main terminals and includes a conduction channel formed in a body region of the switch on and off, the back-gate terminal serves for applying a bias potential to the body region, the battery-powered equipment being characterised in that said switch further comprises an integrated non-parasitic protection diode having a diode path connected in series with the back-gate terminal by providing a rectifying barrier in the bias path between the body region and the back-gate terminal, which rectifying barrier blocks current flow between the body region and the back-gate terminal in the event of a reverse voltage polarity across the first and second main terminals.

* * * * *